United States Patent [19]
Erk et al.

[11] Patent Number: 5,340,437
[45] Date of Patent: Aug. 23, 1994

[54] PROCESS AND APPARATUS FOR ETCHING SEMICONDUCTOR WAFERS

[75] Inventors: Henry F. Erk, St. Louis; Roland R. Vandamme, St. Charles, both of Mo.

[73] Assignee: MEMC Electronic Materials, Inc., St. Peters, Mo.

[21] Appl. No.: 133,980

[22] Filed: Oct. 8, 1993

[51] Int. Cl.⁵ .................... H01L 21/306; B44C 1/22
[52] U.S. Cl. .................... 156/639; 156/345; 156/662
[58] Field of Search ............... 156/637, 639, 645, 646, 156/654, 657, 662, 345; 252/79.2, 79.3, 79.4; 134/3, 22.12, 22.18, 32, 33, 34, 137, 142

[56] References Cited
U.S. PATENT DOCUMENTS

| | | | |
|---|---|---|---|
| 3,880,409 | 1/1974 | Bok et al. | 156/637 X |
| 3,964,957 | 6/1976 | Walsh | 156/345 |
| 4,251,317 | 2/1981 | Foote | 156/639 |
| 4,840,701 | 6/1989 | Stern | 156/637 |
| 4,900,395 | 2/1990 | Swerson et al. | 156/639 |
| 4,971,654 | 11/1990 | Schnegg et al. | 156/638 |
| 5,211,794 | 5/1993 | Enomoto et al. | 156/345 |
| 5,236,548 | 8/1993 | Stadler et al. | 156/639 |
| 5,246,528 | 9/1993 | Hasegawa et al. | 156/639 |

Primary Examiner—William Powell
Attorney, Agent, or Firm—Senniger, Powers, Leavitt & Roedel

[57] ABSTRACT

Process for etching a semiconductor wafer which includes the steps of rotating the wafer, and contacting the rotating wafer with a flowing froth, the froth being formed, at least in part, by the effervescence of a pressurized etchant containing a dissolved gas.

21 Claims, 5 Drawing Sheets

PROCESS AND APPARATUS FOR ETCHING SEMICONDUCTOR WAFERS

BACKGROUND OF THE INVENTION

The invention relates to a process for etching semiconductor wafers in which the wafers are exposed to an etchant in the form of a froth, and to an apparatus for carrying out this process.

Semiconductor wafers, such as silicon wafers, are obtained from a single crystal ingot, such as one grown of silicon, by a process which includes the steps of slicing the ingot in a direction normal to the axis of the ingot to produce a thin wafer, lapping the wafer to planarize its front and back surfaces, etching the wafer to remove any work-damage created by the sawing and lapping and to remove any embedded lapping grit, and polishing the etched surface.

In a typical etching process, a plurality of semiconductor wafers are fixtured in an etch rack or barrel and the entire rack is immersed in an etchant. The etch rack is typically composed of a drum-like casing having one or more parallel, horizontal rollers, each having a plurality of endless circumferential grooves cut in the surface thereof at regular intervals. The grooves are aligned such that a wafer placed in one of the grooves of each of the rollers will stand normal to the axes of the rollers and parallel to other wafers held by the etch rack. The rollers are rotatable about their axes and are driven by a drive mechanism so that each of the wafers is caused to rotate about an axis which is parallel to the axis of the rollers. See, e.g., U.S. Pat. Nos. 3,964,957 and 5,211,794.

Etchants in routine use typically contain a strong oxidizing agent, such as nitric acid, dichromate, or permanganate, a dissolving agent, such as hydrofluoric acid, which dissolves the oxidation product, and a diluent such as acetic acid. The relative proportion of these acids which produces the smoothest and most uniform etching, however, is one at which the removal rate is still relatively high. To minimize nonuniformity, therefore, the wafer rotation speed must be relatively high, e.g., 20 to 30 rpm, to prevent taper from being etched into the wafer. Because the wafers are closely spaced (4 to 7 mm apart), however, any rotation of the wafers tends to produce a rigid-body rotation of the liquid between the wafers and, as a result, the acid between the wafers is relatively stagnant. This rigid-body effect is pronounced at speeds as low as 5 rpm and is problematical at typical rotation speeds of 20 to 30 rpm. This effect, coupled with the large blunt shape of the etch racks or barrels which have been used to date, has led to nonuniform etching across individual wafers and to nonuniform etching along the length of the barrel so that wafers at different positions tend to experience different removals.

In an effort to improve the uniformity of the etching, gases have been sparged into the etch tank and caused to flow between wafers held by the etch rack or barrel. See, e.g., U.S. Pat. Nos. 4,251,317 and 4,840,701. The results, however, have not been entirely satisfactory for several reasons. First, it has proven difficult to produce a uniform flow of gas bubbles across the entire etch rack or barrel as well as across the entire surface of each wafer. Second, the spargers do not tend to produce an approximately equal distribution of small, intermediate and large bubbles which are necessary to produce a wafer which has relatively little microroughness, local thickness variation and total thickness variation; small bubbles (<5 micrometer in diameter) reduce the microroughness of the wafer, intermediate-sized bubbles (5 micrometer to about 2 mm in diameter) preserve low local thickness variation of the wafer, and large bubbles (>2 mm in diameter) preserve low total thickness variation across the diameter of the wafer. Third, because of the high rotation rates typically used, the rigid-body effect has not been entirely eliminated through the use of spargers.

SUMMARY OF THE INVENTION

Among the objects of the invention, therefore, may be noted the provision of a process for etching semiconductor wafers; the provision of such a process in which the rigid-body effect is minimized; the provision of such a process in which wafers can be uniformly etched at relatively slow rotation speeds; the provision of a process in which the etched wafers have a relatively low surface microroughness value, $R_a$ (the arithmetic mean roughness); the provision of a process in which the etched wafers have a relatively low total thickness variation (the difference between the maximum and minimum thickness of the wafer); the provision of a process in which the etched wafers have a relatively low local thickness variation (the difference between the maximum and minimum thickness in a section of a wafer, e.g., a 20 mm by 20 mm section); and the provision of an apparatus for carrying out such a process.

Briefly, therefore, the present invention is directed to a process for etching a semiconductor wafer. The process comprises the steps of rotating the wafer, and contacting the rotating wafer with a flowing froth. The froth is formed, at least in part, by the effervescence of a pressurized etchant containing a dissolved gas.

The present invention is also directed to an apparatus for treating semiconductor wafers. The apparatus includes a rack for holding at least two generally disc-shaped semiconductor wafers wherein the rack defines a fluid chamber having open opposite ends. The apparatus additionally includes a circulatory system for moving a semiconductor wafer processing fluid through the fluid chamber and between said semiconductor wafers.

Other objects and features of this invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENTS

In accordance with the present invention, etched wafers having a mean surface microroughness of less than 0.09 micrometers, preferably less than about 0.07 micrometers ($R_a$), a mean total thickness variation of less than about 1.4 micrometers and a local thickness variation of less than about 0.6 micrometers are provided by a process in which the stock removal from the silicon wafers is less than about 25 micrometers, preferably less than about 20 micrometers. Surface microroughness ($R_a$) determinations may be made in accordance with ASME standard B.46.1 and total thickness variation and local thickness variation determinations may be made in accordance with ASTM standard (preliminary) 20191-Rev 6 or on a tester sold by ADE Corporation (Newton, Mass) under the trade designation UltraGage 9500.

According to this process, the semiconductor wafers are contacted with a flowing etchant which is in the form of a froth. The froth is formed from a pressurized etchant which contains compressed bubbles and a dissolved gas. Upon a sudden pressure drop, the compressed bubbles expand to form intermediate and large sized bubbles and the etchant effervesces to form small bubbles (i.e., the dissolved gas is instantly forced out of solution, forming small bubbles in the same fashion as dissolved carbon dioxide gas bubbles form when the cork is removed from a bottle of champagne).

The gas dissolved in the etchant may be virtually any gas which will not react with the semiconductor wafer or the components of the etchant. These non-reacting gases include elemental gases such as hydrogen, nitrogen, oxygen, and noble gases such as helium, and argon, and compound gases such as carbon dioxide. An inert gas such as helium is most preferred because it has the lowest solubility and thus, would yield the smallest bubbles; helium, however, is relatively cost prohibitive. Hydrogen and oxygen also have relatively low solubilities but are relatively expensive in ultrapure form and/or may, in addition, present a safety hazard. Thus, carbon dioxide and nitrogen are preferred over the other gases and nitrogen is preferred over carbon dioxide because of the two it has the lower solubility.

The etchant includes an oxidizing agent, such as nitric acid, dichromate, or permanganate, and a dissolving agent, such as hydrofluoric acid, which dissolves the oxidation product, and a diluent such as acetic acid, phosphoric acid, glycerine or water. To stabilize the size of the small bubbles, the etchant preferably also includes a surface-active agent which is chemically stable in an acid bath. Exemplary surface-active agents include phosphoric acid and fluorinated surface-active agents such as an ammonium perfluoroalkyl sulfonate, sold under the trade designation FC-93, potassium perfluoroalkyl sulfonates sold under the trade designations FC-95 and FC-98, and a fluorinated alkyl quaternary ammonium iodide sold under the trade designation FC-135 by 3M Corporation (St. Paul, Mn). Phosphoric acid is the preferred surface-active agent since it can advantageously additionally serve as the diluent. More preferably, the etchant contains between about 40 and about 70% nitric acid (supplied as 69 wt. % $HNO_3$ in water), between about 3 and about 11% hydrofluoric acid (supplied as 49 wt. % HF in water) and between about 20 and about 40% phosphoric acid (supplied as 85 wt. % $H_3PO_4$ in water). Most preferably, the etchant comprises 58 vol % nitric acid, 6 vol. % hydrofluoric acid and 36 vol. % phosphoric acid (based on the above-identified source solutions). The ratio of phosphoric acid to nitric acid, therefore, may be within the range of about 1:1 to about 0.25:1, preferably within the range of about 0.5:1 to about 0.7:1, and most preferably is about 0.62:1. The polishing efficiency can be further improved if more concentrated acids are used and the water content is reduced.

The etchant is at a temperature of about 25° C. to about 45° C., preferably about 35° C., and the semiconductor wafer is contacted with the etchant for a period sufficient to achieve a stock removal of no more than about 25 micrometers, preferably of no more than about 20 micrometers. The etch rate as the semiconductor wafer is exposed to the flowing froth is about 2 to about 20 micrometers per minute, preferably about 2.5 to about 15 micrometers per minute, and most preferably about 5 micrometers per minute. Thus, the wafers are etched in the froth for a period of about 1 to about 10 minutes, preferably about 1.5 to about 5 minutes.

The semiconductor wafers are rotated while they are in contact with the flowing etchant. To minimize the rigid body effect, the wafers are rotated at a speed less than about 5 rpm, preferably at a speed less than about 3 rpm, and most preferably at a speed of about 1.5 rpm.

Figure 1:
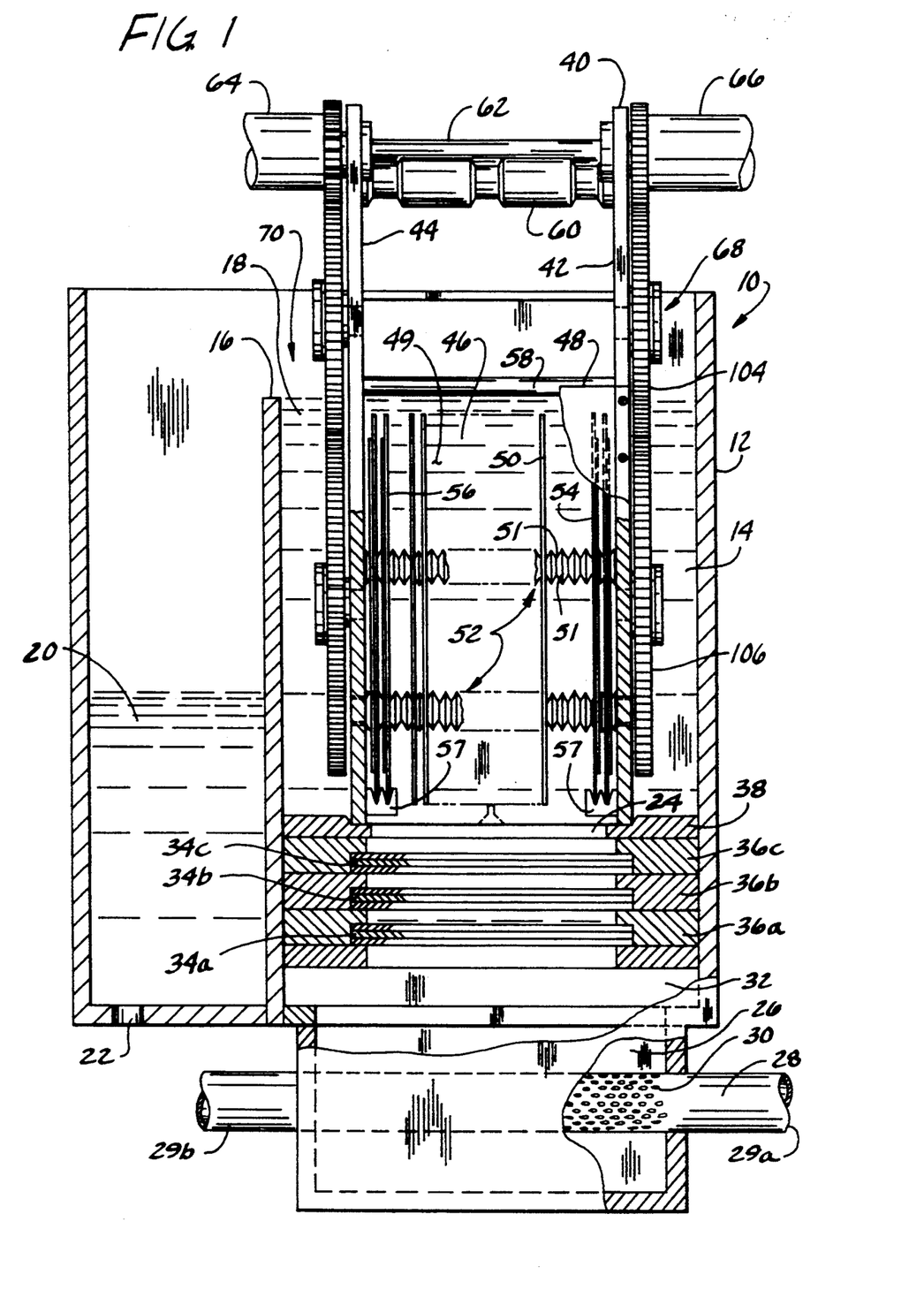
FIG. 1 is a front elevation of a wafer etching apparatus having an etch tank and an etch rack according to the present invention with parts broken away.
Figure 2:
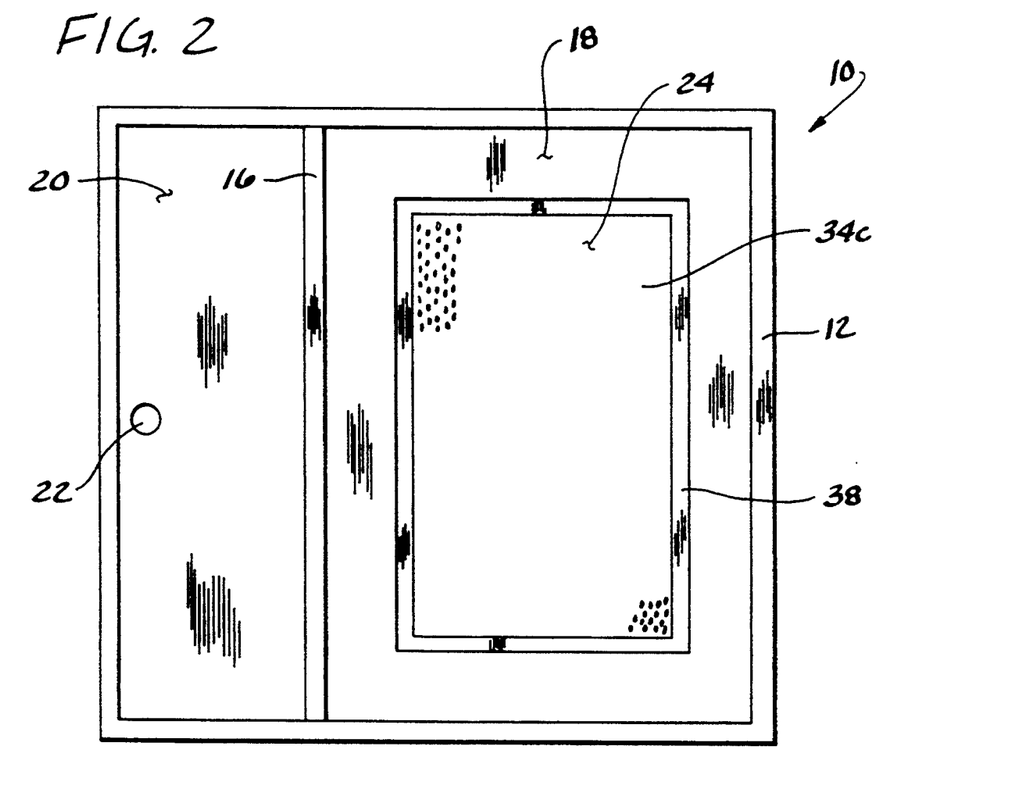
FIG. 2 is a top view of the etch tank of FIG. 1 with the etch rack removed therefrom.

Referring to FIG. 1, the semiconductor wafers are etched in an etching apparatus, designated generally at 10, which includes an etch tank 12 for containing an etchant 14. A weir 16 divides the tank 12 into tank compartments 18 and 20. A drain 22 is at the bottom of tank compartment 20 for removing etchant from the etch tank and an inlet 24 is at the bottom of tank compartment 18 for charging etchant to the etch tank.

Under tank compartment 18 is plenum 26 which is traversed by etchant distribution manifold 28. Etchant distribution manifold is a tube having eighteen rows of holes 30 (17 holes per row, each having a diameter of 1.5 mm) wherein the rows are spaced approximately 20° apart from each other about the circumference of the distribution manifold. The ends 29a and 29b of etchant distribution manifold 28 are connected to an etchant source. Sealing the top of plenum 26 is a plate 32 having a central opening (not shown) therein to permit the upward flow of etchant from the plenum. Preferably, the central opening is a 250 mm by 125 mm rectangle defined by a grid having a series of 50 holes layed-out in a 25×25 mm square grid, the holes having a diameter of 1.5 mm.

Located above the plate 32 are three sets of perforated or porous distributor plates 34a, 34b, and 34c which are supported and separated by spacers 36a, 36b, and 36c. Preferably, each set of distributor plates includes a stack of three superposed porous sheets with the pores ranging in size from about to 200 to 300 micrometers. The sheets may be porous polypropylene sheets such as those sold under the trade designation Porex X4912 by Porex Technology Corp. (Fairburn, Georgia) having pores of about 250 micrometers, comparable porous PVDF sheets, or other comparable sheets. Each plate set is approximately 19 mm thick and each set is separated by a gap of approximately 6.35 mm. The number of plate sets required to evenly distribute the upward flow of etchant across the width and length of the plates for a particular process and apparatus, however, will depend upon the flow rate of the etchant, the type of porous sheet, and the porosity of the sheets.

A frame 38 extends around the perimeter of tank compartment 18 above the plate sets and has a central rectangular opening therethrough defining inlet 24.

Figure 5:
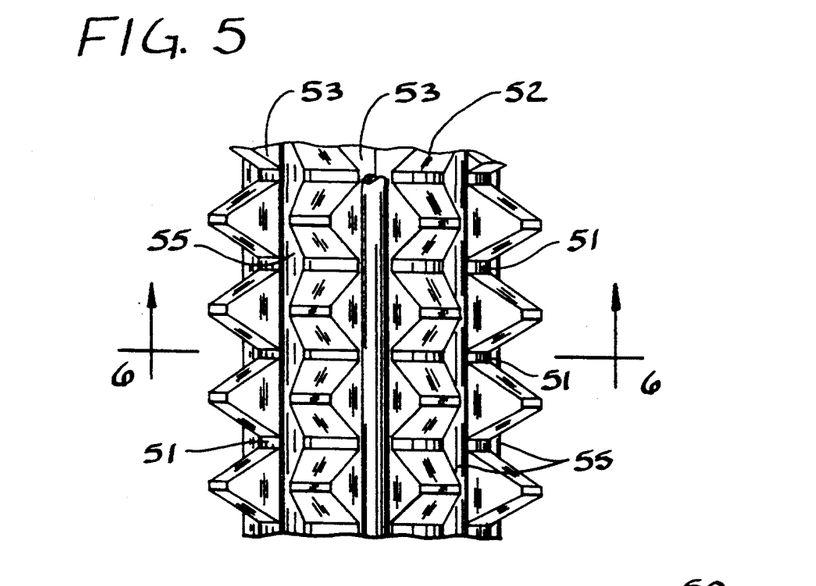
FIG. 5 is a partial top view of one of the rollers of the etch rack of FIG. 1.
Figure 6:
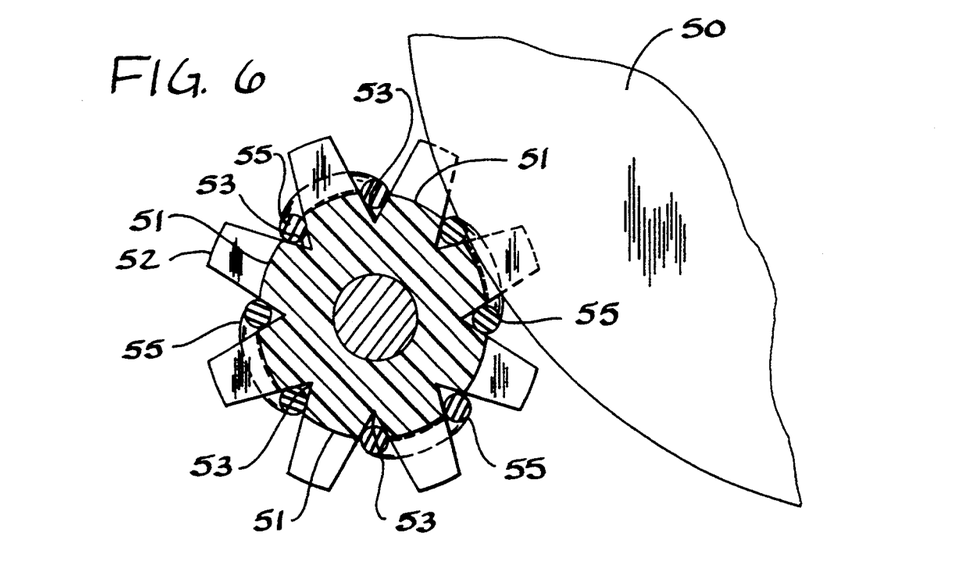
FIG. 6 is a section view taken along the plane of line 6—6 of FIG. 5.

Referring again to FIG. 1, an etch rack, generally designated at 40, has side walls 42 and 44, a back wall 46 and a front wall 48 (only a portion of which is shown). The lower edges of the walls are sized and configured for seating against frame 38 to seal against leakage between the etch rack and frame. The etch rack walls define a fluid chamber 49 through which etchant from inlet 24 flows. Etch rack 40 includes four generally horizontal rollers 52 (two upper rollers 52a, 52b and two lower rollers 52c, 52d) traversing side walls 42 and 44. The rollers 52 are arranged to engage the circumferential edges of a plurality of vertically oriented semiconductor wafers 50 to support the wafers. Each roller has a plurality of axially spaced circumferential grooves 51 (preferably twenty-one grooves) for receiving the wafer edges and a plurality of longitudinal grooves 53 (see FIGS. 5 and 6). Elastomeric bands 55, e.g., bands made from viton or an elastomer sold by Dupont (Wilmington, Delaware) under the trade designation Kalrez, are inserted in the longitudinal grooves 53 of at least one roller, that is, the roller which is located below the center of the wafer and which is urging the edge of the wafer in an upward direction as it is rotated, and preferably two or more rollers to prevent the wafers from slipping on the rollers during rotation of the rollers. The bands 55 are advantageous particularly near the end of the etch cycle when the chemical polishing produces a smooth edge which tends to slip against the plastic rollers. Two pairs of dummy wafers 54 and 56 (e.g., thin plastic or silicon discs having approximately the same diameter as the semiconductor wafers 50) are held adjacent the side walls 42 and 44 of the etch rack by rollers 52 and supports 57. The inner dimensions of the etch rack are preferably about 135×254 mm which will accommodate, in addition to the dummy wafers, seventeen 200 mm wafers or twenty-five 150 mm wafers (assuming the rollers 52 are provided with a sufficient number of circumferential grooves).

Also traversing side walls 42 and 44 are guide 58 which restricts the upward movement of the wafers during the etching process, handles 60 which may be grasped for moving the etch rack, and an axle 62 rotatably connecting two coaxial drive shafts 64 and 66. Rotation of shafts 64 and 66 via an electric motor (not shown) or other suitable mechanism causes rotation of the rollers 52 via two gear trains, generally designated 68 and 70, at opposite ends of the rollers.

Figure 3:
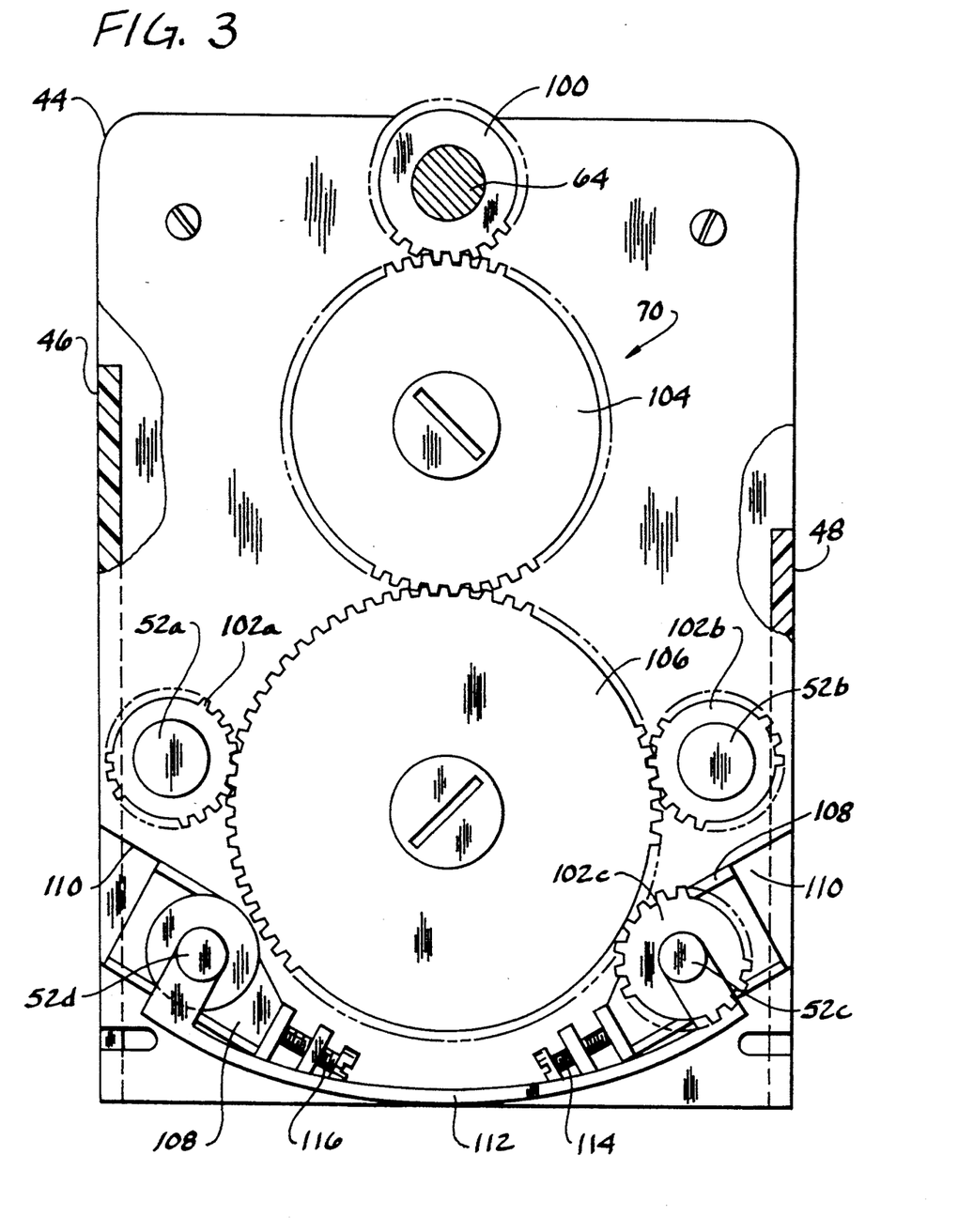
FIG. 3 is a side elevation view of the etch rack of FIG. 1.

As shown in FIG. 3, gear train 70 comprises a drive gear 100 fixed to shaft 64, roller gears 102a, 102b and 102c fixed to ends of the rollers 52a, 52b and 52c, and reduction gears 104 and 106 rotatably coupling the roller gears to the drive gear. The reduction gears are rotatably mounted on the side wall 44 and impart high torque and low speed to the roller gears. Although gear train 70 is shown as having three roller gears, it is to be understood that the gear train may have four roller gears (i.e., a roller gear for each roller including roller 52d) or just two roller gears without departing from the scope of this invention. It is to be understood that gear train 68 is substantially similar to gear train 70.

Opposite ends of the lower rollers 52c and 52d are connected to the side walls 42 and 44 via slide members 108 which ride along recesses 110 formed in the side walls. The slide members are moveable upward and outward relative to the lower reduction gear 106 to disengage the roller gears of the lower rollers from the lower reduction gear and to sufficiently spread the rollers, thereby permitting rapid insertion and removal of the wafers from the etch rack 40. A leaf spring 112 is connected to the lower rollers to urge the rollers downward and inward as viewed in FIG. 3. Application of an upward force against a central portion of the leaf spring 112 causes the lower rollers to move outward. Adjustment screws 114 and 116 are mounted to side wall 44 and engageable with the slide members 108 for adjustably limiting inward movement of the slide members and corresponding rollers.

Generally, semiconductor wafers have an orientation flat at a portion of their circumference for the purpose of indicating the crystal orientation. The rollers, therefore, must be sufficient in number and positioned to prevent radial movement of the wafers when the orientation flat of each wafer is rotated to a position adjacent one of the rollers.

Figure 4:
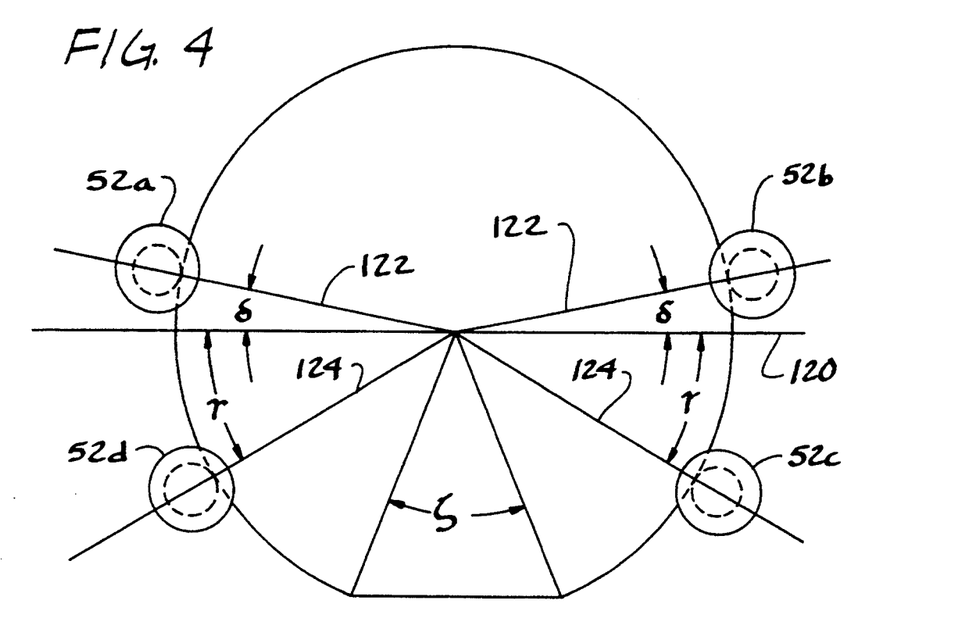
FIG. 4 is a schematic view of rollers of the etch rack of FIG. 1 engaging a typical semiconductor wafer.

Referring specifically to FIG. 4, the etch rack preferably comprises no more than and no fewer than four rollers 52a, 52b, 52c, and 52d. The exact position of the rollers which is required to prevent radial movement of a wafer when its orientation flat is rotated to a position adjacent one of the rollers will vary depending the diameter of the wafer, the length of the orientation flat and the number of degrees of arc the orientation flat occupies. In general, however, angle $\delta$ must be less than angle $\gamma$ and the sum of $\delta$ and $\gamma$ is greater than angle $\zeta$, wherein $\delta$ is the degree of arc of the wafer between a horizontal plane 120 passing through the wafer center and a plane 122 containing the axis of an upper roller and the wafer center, $\gamma$ is the degree of arc of the wafer between the horizontal plane 120 and a plane 124 containing the axis of a lower roller and the wafer center, and $\zeta$ is the degree of arc of the wafer occupied by the flat. Also, angle $\zeta$ is less than the smaller of the two angles defined by any two planes, one of which contains the wafer center and one roller axis and the other of which contains the wafer center and a roller axis adjacent to the one roller axis. Moreover, angle $\gamma$ is preferably as small as possible to minimize the "shadowing" effect the rotating lower rollers have upon the wafer as the etchant froth moves upward past the lower rollers. For example, for a 200 mm wafer having an orientation flat length of about 62 mm, the angle $\gamma$ is about 30° and the angle $\delta$ is about 10°.

Figure 7:
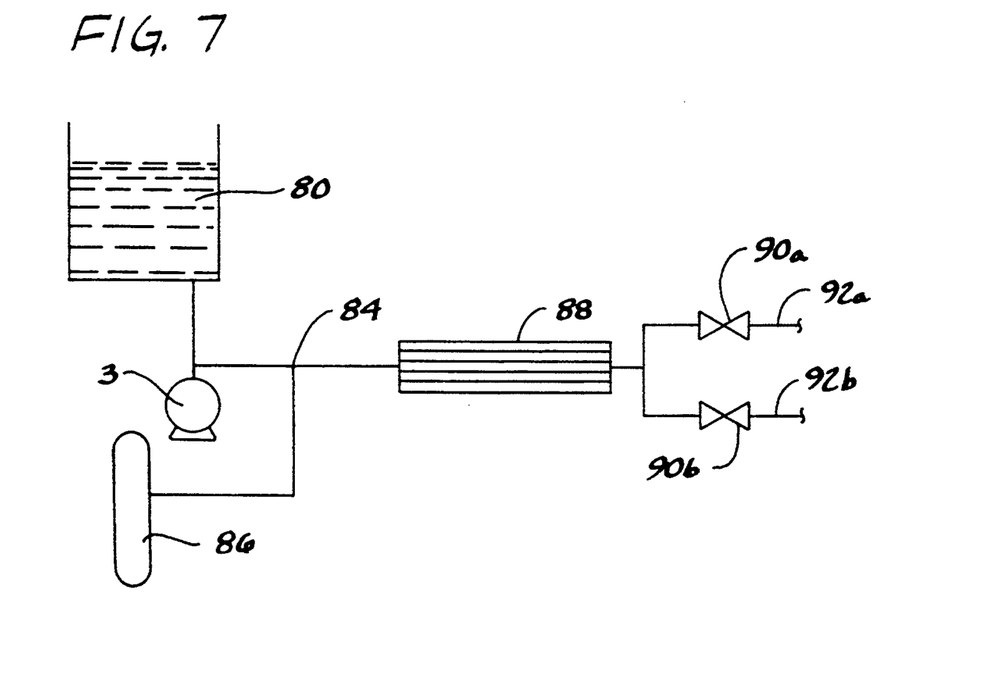
FIG. 7 is a schematic of an apparatus for generating a pressurized acid containing a dissolved gas for delivery to the etching apparatus of FIG. 1.

Referring to FIG. 7, etchant which is held in storage tank 80 is pressurized via circulation pump 82, which may be, for example, a model number MNK-B/F 32-125 centrifugal pump sold by Richter Chemie (Germany) or a model number S16P8-1396V centrifugal sump pump sold by Sta-Rite Industries, Inc. (Delayan, Wisconsin). At branch point 84 in the etchant plumbing, gas from storage tank 86 is introduced into the etchant using, for example, a 25 micrometer porous tube with the end distal to the gas feed line being sealed. To assure intimate etchant-gas mixing, static mixer 88 is installed in the piping. Trim valves 90a and 90b regulate the flow of etchant in lines 92a and 92b which are connected to opposite ends 29a and 29b of etchant distribution manifold 28 (see FIG. 1).

Except as otherwise noted herein, all acid wetted parts are constructed of polyvinylchloride ("PVC"), polyvinylidinedifluoride ("PVDF"), polypropylene or teflon.

In operation, valves 90a and 90b are opened and recirculation pump 82 is energized to cause an etchant contained in storage tank 80 to flow out of etchant distribution manifold 28, through distributor plates 34a, 34b, 34c, through inlet 24 and upward through fluid chamber 49 of the etch rack 40. When the etchant level exceeds the height of the front wall 48, etchant spills over into the tank compartment 18, exteriorly of etch rack 40. When the etchant level exceeds the height of weir 16, which is preferably lower than the height of the front wall 48, etchant spills over into compartment 20 from which it is withdrawn via drain 22 and directed to a sump (not shown) from which it may be returned to storage tank 80 or discarded.

As the etchant flows into the etch tank, the handles 60 of an etch rack, loaded with a plurality of semiconductor and dummy wafers, are grasped (preferably by a robot arm (not shown)) and the etch rack is lowered into tank compartment 18 and seated in frame 38. Simultaneously, the drive mechanism (i.e., gear trains 68 and 70) are rotated to cause the semiconductor wafers to rotate in a direction such that the portion of the circumferential edge of each wafer which is most proximate to side wall 48 is moving in a downward direction (for example, the wafers as viewed in FIG. 3 would be rotated in a clockwise direction). Etchant flowing through inlet 24 is thus forced to flow upward through the etch rack and contact the rotating semiconductor and dummy wafers. After contacting the wafers, the etchant flows over front wall 48 and into tank compartment 18. Consequently, the entire flow of etchant is caused to flow through the etch rack and because the wafers are relatively close to the walls 42 and 44, the etchant must flow between the wafers rather than around them. Typically, the etchant flow rate will be between about 5 and 25 standard liters per minute and is preferably between about 7 and 15 standard liters per minute. The dummy wafers at each of the two ends of the rack promote a more uniform and constant flow between each semiconductor wafer, provided the spacing between the walls 42 and 44 and the dummy wafers nearest the walls is the same as the spacing between the semiconductor wafers and the semiconductor wafers and the dummy wafers. Optionally, one dummy wafer may be used per side instead of two per side.

When the etch rack is initially seated in frame 38 and for the next several seconds, the etchant is essentially a flowing liquid, that is, the etchant does not contain a substantial quantity of bubbles. Thereafter, however, gas from storage tank 86 is introduced into the etchant at branch point 84. For an etchant flow rate between 5 and 25 standard liters per minute, the gas flow rate will be between about 5 and about 70 standard liters per minute, preferably between about 30 and about 50 standard liters per minute, and most preferably about 40 standard liters per minute. The injected gas dissolves in the etchant until the saturation limit is reached. Excess gas does not dissolve, but is carried along with the acid as compressed bubbles. The pressure of the pressurized mixture upstream of valves 90a and 90b is preferably greater than about 2 bar absolute ("abs"), more preferably at least about 3.3 bar abs, and most preferably at least about 4.7 bar abs. As a practical matter, the only constraint upon the etchant pressure is the rating of any pumps, storage vessels and piping used in the process. As the pressurized etchant passes through valves 90a and 90b, therefore, it experiences a sudden pressure drop which results in the formation of a froth containing small, intermediate and large bubbles, the large and intermediate bubbles being formed by the expansion of the compressed bubbles and the small bubbles being formed by effervescence. The pressure drop is at least about 0.7 bar, preferably at least about 2 bar and most preferably at least about 3.3 bar.

The froth is discharged by etchant distribution manifold 28 and moves upwardly and is evenly distributed along the length and the width of the etch rack by distributor plates 34a, 34b, and 34c. In addition, the pore size of distributor plates 34a, 34b, and 34c (which effectively limits the size of the large bubbles) is selected to produce a froth which has an approximately even distribution of small, intermediate and large bubbles.

In conventional processes using nitric acid, hydrofluoric acid and acetic acid as the etchant, the polishing action of the etch diminishes and the etching action becomes erratic as the amount of acetic acid is increased. Thus, the ratio of acetic acid to nitric acid cannot practically become greater than about 1:2 and the etch rate cannot be reduced to rates less than about 50 micrometers per minute without diminishing the polishing action of the etchant. When phosphoric acid is used as the diluent in place of acetic acid, however, the etch rate is reduced to about 2 to 20 micrometers per minute without a negative impact upon the polishing action of the etchant, that is, the etchant will provide a smooth, polished surface with minimum stock removal. Etch rates of this magnitude are much easier to control and thus, the wafers can be rotated at a rate which minimizes the rigid-body rotation effect.

The wafers are etched in the froth for a period of about 1 to 10 minutes depending upon the aggressiveness of the etchant, e.g., upon the hydrofluoric acid concentration. During this period, the stock removal from the wafer will be between about 20 to about 25 micrometers. The injection of gas at branch point 84 is then discontinued but the flow of liquid etchant continues until substantially no bubbles remain in the etch rack. The handles 60 of the etch rack are then grasped (preferably by a robot arm (not shown)) and the etch rack is removed from the etch tank and immersed in a water rinse tank (not shown) to remove any etchant which may remain on the surface of the wafers. Preferably, the robot arm engages the drive shaft of the etch rack which was not engaged during the froth etching to rotate the wafers as they are being transported from the etch tank to the rinse tank.

The following examples will illustrate the invention.

EXAMPLE 1

Using the apparatus depicted in FIGS. 1-7 and the process described above, six thousand 200 mm silicon wafers were etched with a nominal removal of 25 micrometers in a froth formed from an etchant comprising 58 vol. % nitric acid (supplied as 69 wt. % in water), 6 vol. % hydrofluoric acid (supplied as 49 wt. % in water) and 36 vol. % phosphoric acid (supplied as 85 wt. % in water). Smooth wafers with a gloss reflectance value of 240±60 as determined by the methods of ASTM D-523-85, DIN 67530 or ISO 2813 were produced. The mean surface roughness was determined to be 0.06 to 0.09 micrometers ($R_a$) in accordance with ASME standard B.46.1. The mean total thickness variation of the wafer was determined to be 1.37 micrometers ($\sigma=0.33$) and the mean local thickness variation was determined to be 0.55 micrometers ($\sigma=0.1$) in accordance with ASTM standard (preliminary) 20191-Rev 6 on a tester sold by ADE Corporation (Newton, Mass) under the trade designation UltraGage 9500.

EXAMPLE 2

Sixty-four 200 mm wafers were etched with a nomial removal of 20 micrometers in a froth formed from an etchant comprising 57 vol. % $HNO_3$ (supplied as 69 wt. % $HNO_3$ in water), 35 vol. % $H_3PO_4$ (supplied as 85 wt. % $H_3PO_4$ in water), and 8 vol. % HF (supplied as 49 wt. % HF in water). A random sample of fifteen wafers was taken from the lot and measured for gloss, total thickness variation, local thickness variation and surface roughness. The fifteen wafers were found to have a mean gloss reflectance value of 272 ($\sigma=18$) as determined by ASTM D-523-85 and a mean total thickness variation of 1.23 micrometers ($\sigma=0.16$) and mean local thickness variation of 0.55 micrometers ($\sigma=0.09$) as a determined in accordance with ASTM standard (preliminary) 20191-Rev 6 on a tester sold by ADE Corporation (Newton, Mass) under the trade designation UltraGage 9500. Eight of the fifteen wafers were measured for surface roughness and were found to have a mean surface roughness of 0.073 micrometers ($R_a$) ($\sigma=0.008$) in accordance with ASME standard B.46.1.

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

We claim:

1. A process for etching a semiconductor wafer comprising the steps of:
    rotating the wafer, and
    contacting the rotating wafer with a flowing froth, the froth comprising bubbles formed by the effervescence of an etchant containing a dissolved gas.

2. A process as set forth in claim 1 wherein the etchant comprises a surface-active agent.

3. A process as set forth in claim 1 wherein the etchant comprises phosphoric acid and is at a pressure of at least 35 psig before it effervesces.

4. A process as set forth in claim 1 wherein the wafers are rotated at a rate not in excess of about 5 revolutions per minute.

5. A process as set forth in claim 1 wherein the stock removal from the wafers does not exceed 25 micrometers.

6. A process as set forth in claim 1 wherein the froth is formed from a pressurized etchant which experiences a pressure drop of at least about 30 psi, the pressurized etchant comprising nitric acid, hydrofluoric acid, phosphoric and, prior to the pressure drop, compressed bubbles and a dissolved gas.

7. A process as set forth in claim 1 wherein the dissolved gas is selected from the group consisting of helium, hydrogen, nitrogen, oxygen, argon and carbon dioxide.

8. The process of claim 1 wherein the semiconductor wafer is simultaneously etched with at least one other semiconductor wafer, the semiconductor wafers being fixtured in an etch rack having parallel, horizontal rollers which cause the wafers to rotate about an axis which is parallel to the axis of the rollers, the etch rack defining a fluid chamber having open opposite ends, the froth flowing in one and out of the other open opposite ends, the direction of the flow of the froth being generally transverse to the axis of rotation of the wafers.

9. A process as set forth in claim 1 wherein the semiconductor wafer is simultaneously etched with at least one other semiconductor wafer, the semiconductor wafers being fixtured in an etch rack having no more than four parallel, horizontal rollers which support the wafers, each roller having a plurality of endless circumferential grooves cut in the surface thereof at regular intervals, the grooves being aligned such that a wafer placed in one of the grooves of each of the rollers will stand normal to the axes of the rollers and parallel to other wafers held by the etch rack, the rollers being rotative about their axes and driven by a drive mechanism so that each of the wafers is caused to rotate about an axis which is parallel to the axis of the rollers.

10. Apparatus for treating semiconductor wafers comprising:
    a rack for holding at least two generally disc-shaped semiconductor wafer, said rack defining a fluid chamber having an inlet end and an outlet end; and
    a circulatory system for moving a semiconductor wafer processing fluid through the fluid chamber from the inlet end to the outlet end and between said semiconductor wafers.

11. Apparatus as set forth in claim 10 wherein said circulatory system comprises a plenum in communication with the inlet end of the fluid chandler.

12. Apparatus as set forth in claim 10 wherein said fluid chamber and circulatory system are configured so that essentially all fluid moved by the circulatory system passes through the fluid chamber.

13. Apparatus as set forth in claim 10 further comprising a drive mechanism for rotating the wafers.

14. Apparatus as set forth in claim 13 wherein said drive mechanism comprises a plurality of rollers adapted to engage the peripheries of said wafers for rotating said wafers.

15. Apparatus as set forth in claim 14 wherein no more than four rollers engage the peripheries of said wafers.

16. Apparatus as set forth in claim 15 wherein said rollers rotate about four parallel, horizontal axes, wherein two of the four rollers, constituting upper rollers, engage the peripheries of the wafers generally above a horizontal plane passing through the centers of the wafers, and wherein the other two rollers, constituting lower rollers, engage the peripheries of the wafers generally below the horizontal plane, said wafers being generally normal to the roller axes.

17. Apparatus as set forth in claim 16 wherein an angle $\delta$, being defined as the acute degree of arc of the wafer between the horizontal plane and a plane including either of the axes of the upper rollers and the wafer centers, is less than an angle $\gamma$, being defined as the acute degree of arc of the wafer between the horizontal plane and a plane including either of the axes of the lower rollers and the wafer centers.

18. Apparatus as set forth in claim 17 wherein the drive rollers are spaced sufficiently to accommodate wafers having orientation flats such that the degree of arc of the wafers occupied by the flats is less than the smaller of the two angles defined by two planes, one of which contains the wafer centers and any one roller axis and the other of which contains the wafer centers and a roller axis adjacent to said one roller axis.

19. Apparatus as set forth in claim 14 further comprising at least two generally disc shaped dummy wafers of a non-semiconductor material in engagement with and rotated by said rollers, the semiconductor wafers being disposed between and generally parallel to said dummy wafers, the dummy wafers being rotated by the rollers at substantially the same rotational speed as the semiconductor wafers.

20. Apparatus as set forth in claim 19 wherein the diameter and thickness of each dummy wafer is substantially the same as the diameter and thickness of each semiconductor wafer.

21. Apparatus as set forth in claim 14 wherein each roller includes at least two circumferential grooves for receiving the peripheries of the wafers, and a plurality of longitudinal grooves, said circumferential grooves maintaining axial alignment of the wafers, each roller further comprising elastomeric bands positioned within and extending along the longitudinal grooves, said elastomeric bands being engageable with the peripheries of the wafers.

* * * * *